United States Patent [19]

Chen

[11] 4,138,532

[45] Feb. 6, 1979

[54] N-METHYLPHENAZINE PHOTOGALVANIC CELL

[75] Inventor: Schoen-nan Chen, North Brunswick, N.J.

[73] Assignees: Optel Corporation, Princeton, N.J.; Grumman Aerospace Corporation, Bethpage, N.Y.; part interest to each

[21] Appl. No.: 740,875

[22] Filed: Nov. 11, 1976

[51] Int. Cl.² .......................... H01M 6/30; H01M 6/36
[52] U.S. Cl. .................................................... 429/111
[58] Field of Search .................. 429/111; 136/89 NB

[56] References Cited

U.S. PATENT DOCUMENTS 3,989,542  11/1976  Clark ............................... 429/111 X

OTHER PUBLICATIONS

W. D. Clark et al, "Photogalvanic Cells," Solar Energy, vol. 17, pp. 147-150 (1975).
J. R. Bolton, "Photochemical Storage of Solar Energy by the Dye Sensitized Photolysis of Water," Proc. VIII Int'l Conf. on Photochem, Edmonton, Canada, Aug. 1975.
R. A. Hann et al, "Photogalvanic Output from Cells Containing Organic Dye," Nature Physical Science, vol. 244, Aug. 1973, pp. 126-127.
R. Gomer, "Photogalvanic Cells," Electrochimica Acta, vol. 20, pp. 13-20 (1975).

*Primary Examiner*—John H. Mack
*Assistant Examiner*—Aaron Weisstuch
*Attorney, Agent, or Firm*—Morris Liss; Israel Gopstein

[57] ABSTRACT

A photogalvanic cell having a light transparent electrode and a spaced counterelectrode separated by an electrolyte. The electrolyte includes an n-methylphenazine dye system which not only contributes to the conversion of light to electrical energy but also is capable of storing electrical charge after light is removed.

4 Claims, 2 Drawing Figures

N-METHYLPHENAZINE PHOTOGALVANIC CELL

FIELD OF THE INVENTION

The present invention relates to photogalvanic cells and more particularly to a photogalvanic cell using a fluid dye system as an electrolyte.

BRIEF DESCRIPTION OF THE PRIOR ART

The use of a dye system in the electrolyte of a photogalvanic cell is well known. In an article appearing in the publication "Solar Energy", Volume 17, pages 147-150, Pergamon Press, 1975 and entitled PHOTOGALVANIC CELLS by Clark and Eckert, the theory and structure for photogalvanic cells is presented, showing that they are electrochemical cells which are recharged with light. A description in the article of a photogalvanic cell is based on an iron-thionine dye system which demonstrates a relatively low power conversion efficiency for absorbed monochromatic light. It is pointed out in the article that the concept of the photogalvanic cell should not be confused with a photovoltaic cell as the fundamental operation of the two devices is entirely different. The photovoltaic cell relies on direct excitation of an electron by a photon to produce electricity while the photogalvanic cell relies on the excitation of a molecule by a photon which induces chemical reactions to render high energy products. These products can subsequently lose their energy electrochemically, as in an ordinary battery. These reactions are more generally known as reversible, endergonic photochemical processes or reactions which are pushed uphill with light.

The particular photogalvanic cell which is disclosed in the aforementioned article relies on the iron-thionine endergonic system. The photochemical processes involved are reversible and not complicated by competing side reactions when extraneous oxidants and reductants are excluded. The electrolyte utilized is stated as being an aqueous-acid medium.

The iron-thionine dye system which is utilized normally exists as a purple solution when not exposed to sunlight. However, when there is exposure to sunlight, the solution becomes colorless due to the formation of the leucothionine. The purple color reappears when the solution is taken out of sunlight in a matter of seconds. This operation can be performed repeatedly and demonstrates the reversibility of the system.

With respect to specific materials used in the cell of the mentioned prior art, the concentrations of species in solutions depend on the solvent for maximum photogalvanic response but generally are in the range of $10^{-2}$ M for ferrous ion, $10^{-3}$ to $10^{-5}$ M for ferric ion and thionine, and $10^{-1}$ to $10^{-3}$ M for hydrogen ion in aqueous and aqueous-organic solutions.

The discussed prior art discloses the structure of an actual photogalvanic cell using the iron-thionine electrolyte system. The structure includes spaced electrodes comprising transparent Nesa glass and platinum sputtered on glass. Fluorinated hydrocarbon separators are used between the electrodes and are extremely thin to allow the electrolyte solution to be held between the two electrodes by capillary action. The device is sealed with any suitable inert material such as paraffin wax or polyethylene.

Although the discussed prior art cell accomplishes power conversion, the efficiency of the cell is demonstrated to be quite low, in the nature of 0.15 percent. It is recognized that one of the contributing problems for this low conversion efficiency is that the iron-thionine single dye system only absorbs a fraction of the available sunlight. At best, test results verify that thionine at best absorbs only 10 percent of the total spectrum. It is mentioned in the aforementioned article that the authors are investigating with other thionine-type dyes which absorb in other areas of the spectrum, the hope of the authors being to design a mixed dye system which will absorb more of the solar spectrum.

In a copending application entitled DYE-TITANIUM DIOXIDE PHOTOGALVANIC CELL by Chen et al Ser. No. 740,876, filed Nov. 11, 1976, now U.S. Pat. No. 4,080,488, a photogalvanic cell is disclosed which includes an electrode and counterelectrode that are physically separated by an aqueous electrolyte which contains the specific dye of the present invention dissolved in solution as well as $TiO_2$ suspended therein, as a pigment powder, the cell relying principally upon the $TiO_2$ for the actual conversion of light to electrical energy.

The prior art includes photogalvanic cells relying upon a $TiO_2$-electrolyte interface for constituting a photoactive site which converts irradiating light energy to electrical energy. In copending U.S. patent application Ser. No. 582,344, filed May 30, 1974, now U.S. Pat. No. 4,085,257 there is brief mention of the possibility of using a dye system in a photogalvanic cell. This is mentioned on page 6, line 21, of the referenced copending application. Although the usefulness of the dye system in a photogalvanic cell was theorized, the application of specific dyes was not envisioned by that invention.

In a published paper in *Proceedings VIII International Conference on Photochemistry*, Edmonton, Canada, August, 1975, by James R. Bolton entitled "Photochemical Storage of Solar Energy by the Dye Sensitized Photolysis of Water" use of the particular dye, relied upon by the present invention, is recognized. In FIG. 2, the embodiment disclosed by Bolton is illustrated. In the left-hand compartment, a dye D (which should be a good donor in the ground state) will be excited by light so that the excited state D* is able to reduce water to hydrogen leaving the oxidized dye $D^+$. In the right-hand compartment, a dye A (which should be a good acceptor in the ground state) will be excited by light so that A* will be able to oxidize water to oxygen leaving the reduced dye $A^-$. The two compartments are then coupled together electrochemically so that $A^-$ can spontaneously reduce $D^+$ thus restoring the dyes to their original states. The dark reactions following the photochemical electron transfers may be rather complex and specific catalysts capable of storing electrochemical equivalents will be required. Bolton discovered a reaction which partially meets the requirements for the dye A. The dye is the N-methylphenazinium cation ($NMP^+$). At wavelengths less than 500 nm $NMP^+$ is able to photooxidize water yielding the reduced dye $NMPH^+$ and .OH radicals.

Although the Bolton concept recognized the particular dye utilized in the present invention, his structure was directed to a multi-compartment cell for achieving photolysis of water.

BRIEF DESCRIPTION OF THE PRESENT INVENTION

With respect to the iron-thionine cell, the present invention is directed to an alternate dye system for a photogalvanic cell having a structure similar to that of the prior art. However, an entirely different dye system is used in the electrolyte which achieves spectral sensitivity in the region ranging from 500 nm down to ultra-violet. This is in contrast to the iron-thionine photogalvanic cell which is not sensitive below 500 nm. The present photogalvanic cell should exhibit a greater power conversion efficiency. A second distinct advantage of the present invention over the iron-thionine prior art relies upon the fact that the dye utilized in the present electrolyte, namely, N-methylphenazine, is capable of achieving charge storage in addition to energy conversion from light to electrical forms of energy.

BRIEF DESCRIPTION OF THE FIGURE

The above-mentioned objects and advantages of the present invention will be more clearly understood when considered in conjunction with the accompanying drawings, in which.

DETAILED DESCRIPTION OF THE INVENTION

Figure 1:
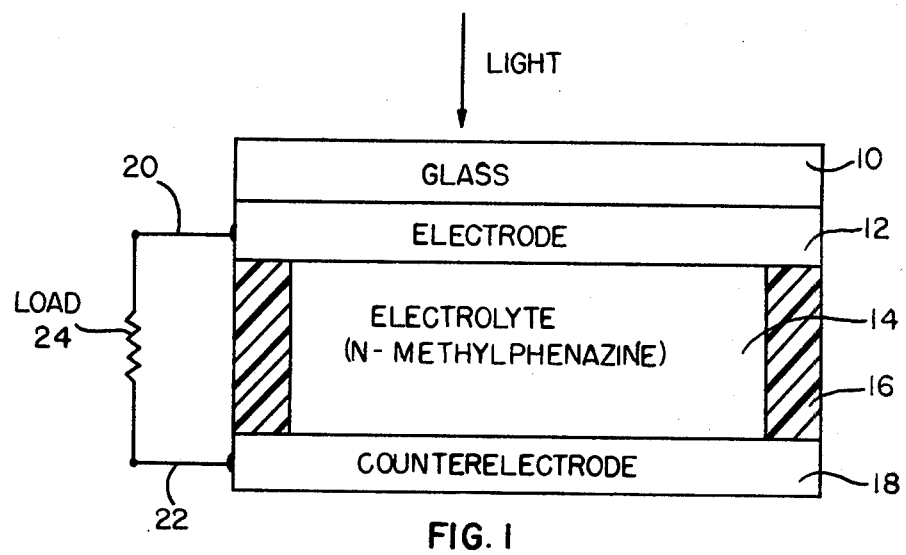
FIG. 1 is a diagrammatic cross-sectional view of a photogalvanic cell which constitutes the present invention.
Figure 2:
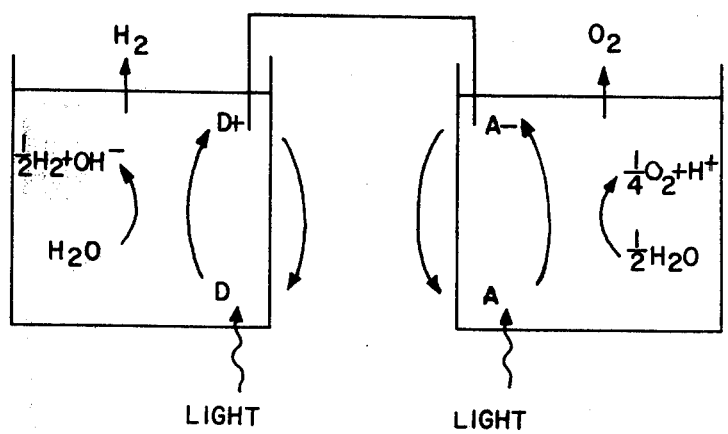
FIG. 2 is a diagrammatic illustration of the mentioned Bolton device.

Referring to FIG. 1, the photogalvanic cell of the present invention is seen to include a light transparent substrate material such as glass 10. A thin film or layer of conducting material is deposited onto the glass to function as electrode 12. In a preferred embodiment of the invention, the electrode 12 is fabricated from a transparent thin film conducting material such as $SnO_2$. A prefabricated material including the glass and the electrode deposited thereon is commercially available and is known in the industry as Nesa glass.

A counterelectrode 18 is positioned in spaced registry with electrode 12 and may be fabricated from a disc of carbon or a platinized carbon member. In the event of the latter, the platinum may be deposited on the carbon material by conventional metalization techniques.

The aqueous material between the electrode 12 and the counterelectrode 18 is the electrolyte which includes the previously mentioned N-methylphenazine dye system. The electrolyte is an aqueous medium which includes a conventional acid, such as sulphuric acid. The aqueous medium has N-methylphenazine methosulfate added thereto, the latter being commercially available from a number of sources such as Eastman Kodak Company, and is available in powdered form.

An annular wall 16 is transversely disposed between and connected to the electrode 12 and counterelectrode 18 and serves the purpose of sealing the electrolyte 14 within the device as well as supporting the internal cell components. The wall 16 may be fabricated from most any suitable inert and electrically insulative material such as epoxy or polyethylene.

Wires 20 and 22 respectively are connected to the electrode 12 and counterelectrode 18. A load 24 is connected between these wires and draws current from the device when the latter is exposed to light.

The transparent electrode 12 is a thin film semiconductor and upon irradiation by light shorter than 500 nm, the transparent electrode becomes negatively charged while the counterelectrode becomes positively charged. As a result, electric current will be drawn by load 24.

It has been found that the particular dye system including the N-methylphenazinium ions permits the cell to also store electrical energy. Accordingly, the cell could be charged without an attached load and after irradiating energy ceases, a load may be connected across the cell for power.

The stability of the present N-methylphenazine photogalvanic cell may be improved by adding to the electrolyte a suitable redox couple, such as Fe(II)–Fe(III).

The suspected mechanism for the theoretical operation of the device is that the light excites the molecules of the dye to reach excited states. The excited molecules or their photoproducts eject electrons and these are collected by the electrodes or stored in the electrolyte for later use by a connected load.

It should be understood that the invention is not limited to the exact details of construction shown and described herein for obvious modifications will occur to persons skilled in the art.

I claim the following:
1. A photogalvanic cell comprising:
    a light transmissive semiconductor electrode;
    a counterelectrode;
    an electrolyte contained between the electrode and the counterelectrode, the electrolyte incorporating a dye system which includes N-methylphenazinium ions in an acid medium, having a spectral sensitivity ranging from 500 nm down to the ultra-violet region;
    means contacting the electrodes for drawing current from the cell as light irradiates the cell, said dye system further providing means for storing electrical energy within said cell for delivery after termination of irradiation.
2. The subject matter set forth in claim 1 wherein the N-methylphenazinium ions are derived from N-methylphenazine methosulfate.
3. The subject matter set forth in claim 2 together with a redox couple included in the electrolyte for improving the stability of the electrolyte.
4. The subject matter set forth in claim 3 wherein the redox couple is Fe(II)–Fe(III).